(12) United States Patent
Bahir et al.

(10) Patent No.: US 8,492,702 B2
(45) Date of Patent: Jul. 23, 2013

(54) METHOD AND SYSTEM FOR DETECTING LIGHT HAVING A LIGHT ABSORBING LAYER WITH BANDGAP MODIFYING ATOMS

(75) Inventors: Gad Bahir, Haifa (IL); Dan Fekete, Zikhron-Yaakov (IL); Asaf Albo, Hiafa (IL)

(73) Assignee: Technion Research & Development Foundation Limited, Haifa (IL)

( * ) Notice: Subject to any disclaimer, the term of this patent is extended or adjusted under 35 U.S.C. 154(b) by 309 days.

(21) Appl. No.: 13/031,293

(22) Filed: Feb. 21, 2011

(65) Prior Publication Data

US 2011/0204214 A1  Aug. 25, 2011

Related U.S. Application Data

(60) Provisional application No. 61/306,504, filed on Feb. 21, 2010.

(30) Foreign Application Priority Data

Feb. 21, 2010 (IL) .......................... 204083
Feb. 23, 2010 (IL) .......................... 204122

(51) Int. Cl.
*H01J 5/06* (2006.01)
(52) U.S. Cl.
USPC ....................... 250/226; 250/214.1
(58) Field of Classification Search
USPC ................... 250/226, 214.1, 216; 257/21–28, 257/431, 189, 441, 15; 438/74–98
See application file for complete search history.

(56) References Cited

U.S. PATENT DOCUMENTS

| | | | |
|---|---|---|---|
| 5,155,571 A | 10/1992 | Wang et al. | |
| 6,603,784 B1 | 8/2003 | Johnson | |
| 6,975,660 B2 | 12/2005 | Johnson | |
| 7,109,526 B2 | 9/2006 | Gentner et al. | |
| 7,256,417 B2 | 8/2007 | Mawst et al. | |
| 7,391,507 B2 | 6/2008 | Chism, II | |
| 7,457,338 B2 | 11/2008 | Mawst et al. | |
| 7,737,411 B2 | 6/2010 | Gunapala et al. | |
| 7,768,048 B2 | 8/2010 | Ueno et al. | |
| 8,003,434 B2* | 8/2011 | Maimon | 438/98 |
| 8,154,008 B2 | 4/2012 | Lee et al. | |
| 2004/0259284 A1 | 12/2004 | Lin | |
| 2005/0017176 A1 | 1/2005 | Koch et al. | |
| 2005/0056868 A1 | 3/2005 | Gentner et al. | |
| 2005/0170542 A1 | 8/2005 | Matsumura | |
| 2005/0173694 A1 | 8/2005 | Mawst et al. | |
| 2007/0009001 A1 | 1/2007 | Shigihara | |
| 2007/0215900 A1 | 9/2007 | Maimon | |
| 2007/0221908 A1 | 9/2007 | Takahashi et al. | |
| 2007/0228358 A1 | 10/2007 | Ofek | |

(Continued)

OTHER PUBLICATIONS

Office Action Dated Dec. 26, 2012 From the Israel Patent Office Re. Application No. 204083 and Its Translation Into English.

(Continued)

*Primary Examiner* — Que T Le

(57) ABSTRACT

A light detection system is disclosed. The system comprises a light absorbing layer made of a semiconductor having majority carriers and minority carriers, and being incorporated with bandgap modifying atoms at a concentration selected so as to allow generation of photocurrent indicative of absorption of photons at any wavelength at least in the range of from about 3 μm to about 5 μm.

30 Claims, 8 Drawing Sheets

U.S. PATENT DOCUMENTS

| | | |
|---|---|---|
| 2007/0248135 A1 | 10/2007 | Mawst et al. |
| 2008/0112452 A1 | 5/2008 | Chakraborty et al. |
| 2010/0072457 A1 | 3/2010 | Iguchi et al. |
| 2010/0118905 A1 | 5/2010 | Yabushita et al. |
| 2010/0295095 A1 | 11/2010 | Klipstein |
| 2010/0308300 A1 | 12/2010 | Pan |
| 2013/0075694 A1 | 3/2013 | Albo et al. |

OTHER PUBLICATIONS

Restriction Official Action Dated Feb. 22, 2012 From the US Patent and Trademark Office Re. U.S. Appl. No. 12/789,481.

Bank et al. "Recent Progress on 1.55-?m Dilute-Nitride Lasers", IEEE Journal of Quantum Electronics, 43(9): 773-785, Sep. 2007.

Klipstein "'XBn' Barrier Photodetectors for High Sensitivity and High Operating Temperature Infrared Sensors", Proceedings of SPIE, the International Society of Optical Engineering, 34th Conference on Infrared Technology and Applications, Orlando, FL, USA, Mar. 17-20, 2008, 6940(2): 69402U.1-69402U.12, 2008.

Maimon et al. "NBn Detector, An Infrared Detector With Reduced Dark Current and Higher Operating Temperature", Applied Physics Letters, 89: 151109-1-151109-3, 2006.

Mawst et al. "MOCVD-Grown Dilute Nitride Type II Quantum Wells", IEEE Journal of Selected Topics in Quantum Electronics, 14(4): 979-991, Jul./Aug. 2008.

Peter et al. "Realization and Modeling of a Pseudomorphic (GaAs1—xSbx—InyGa1—yAs)/GaAs Bilayer-Quantum Well", Applied Physics Letters, 67(18): 2639-2641, Oct. 30, 1995.

Notice of Allowance Dated Jun. 22, 2012 From the US Patent and Trademark Office Re. U.S. Appl. No. 12/789,481.

Official Action Dated Sep. 18, 2012 From the US Patent and Trademark Office Re. U.S. Appl. No. 12/789,479.

Notice of Allowance Dated Oct. 2, 2012 From the US Patent and Trademark Office Re. U.S. Appl. No. 13/031,302.

Bedair "Atomic Layer Epitaxy Deposition Processes", Journal of Vacuum Science & Technology B, 12(1): 179-185, Jan./Feb. 1994.

Gendron et al. "Quantum Cascade Photodetector", Applied Physics Letters, 85(14): 2824-2826, Oct. 4, 2004.

Shields et al. "Detection of Single Photons Using a Field-Effect Transistor Gated by a Layer of Quantum Dots", Applied Physics Letters, 76(25): 3673-3675, Jun. 19, 2000.

Yoon et al. "Self-Assembled GaInNAs/GaAsN Quantum Dot Lasers: Solid Source Molecular Beam Epitaxy Growth and IIigh-Temperature Operation", Nanoscale Research Letters, 1: 20-31, 2006.

Notice of Allowance Dated Apr. 10, 2013 From the US Patent and Trademark Office Re. U.S. Appl. No. 13/656,852.

Official Action Dated Apr. 29, 2013 From the US Patent and Trademark Office Re. U.S. Appl. No. 12/789,479.

* cited by examiner

METHOD AND SYSTEM FOR DETECTING LIGHT HAVING A LIGHT ABSORBING LAYER WITH BANDGAP MODIFYING ATOMS

RELATED APPLICATIONS

This application claims the benefit of priority of Israel Patent Application Nos. 204083 filed Feb. 21, 2010, and 204122 filed Feb. 23, 2010, and of U.S. Provisional Patent Application No. 61/306,504 filed Feb. 21, 2010, the contents of which are incorporated herein by reference in their entirety.

FIELD AND BACKGROUND OF THE INVENTION

The present invention, in some embodiments thereof, relates to photodetection and, more particularly, but not exclusively, to the detection of photons by an active region which comprises bandgap modifying atoms.

Recording and measuring a weak signal presents challenging and acute problems for the designers of modern sensors for myriad applications in diverse fields of science and technology. In these sensors, various primary signals (optical, ultrasonic, mechanical, chemical, radiation, etc.) are transformed into elementary charge carriers, such as electrons, holes or ions. Signal charge packets of such elementary charge carriers are amplified and converted to an electrical signal which is fed into a recording or analyzing device and/or used as a feedback signal for monitoring.

One approach to the detection of weak optical signals is the use of photodetectors in which the exposure times are long. These photodetectors typically employ semiconductor technology. Since the energy of photon is inversely proportional to its wavelength the detection of long wavelength photons, particularly in the infrared (IR) range, is more difficult.

Currently, prevalent infrared photodetection technology is based on interband (IB) absorption, wherein (IB) transitions occur in narrow bandgap semiconductors such as HeCdTe, InSb, InAs and InGaAs. Another technology is based on intersubband (ISB) transitions in heterostructures in a configuration known as Quantum Well Infrared Photodetectors (QWIP), wherein the photodetection mechanism is via absorption between subbands rather than between the valence and conduction bands. An additional technology is based on type-II superlattice structures engineered by deposition of a stack of successive semiconductor layers. Although much effort is invested in improving the performances of all types of IR detectors, none of the above technologies was proven to be sensitive enough for single photon detection.

Another class of detectors is based on a unipolar barrier layer between a contact layer and an absorption layer. The barrier layer suppresses a dark current and allows the device to operate with low diffusion current. The barrier is designed so that it only blocks the passage of majority carriers, while the minority carriers are free to flow from the absorbing layer to the contact layer. The term "unipolar barrier" was coined recently to describe a barrier that can block one carrier type (electron or hole) but allows the un-impeded flow of the other. The barrier can also prevent the depletion of the narrow bandgap photon absorbing layer suppression of generation-recombination (G-R) dark current due to Shockley-Read-Hall (SRH) processes. Such devices have been termed nBn [Maimon et al. "nBn detector, an infrared detector with reduced dark current and higher operating temperature," Applied Physics Letters 89, 151109 (2006)] or, more generally, XBn [P Klipstein, "'XBn' Barrier Photodetectors for High Sensitivity and High Operating Temperature Infrared Sensors," Proc. SPIE 6940 (2009) 69402U], where "X" stands for the contact layer, "B" stands for the barrier layer, and "n" stands for the active layer.

In the general XBn devices, the bandgaps of the contact layer and active layer may differ, while in the more specific nBn devices, the bandgap of the contact layer is generally the same as the bandgap of the active layer.

Additional background art includes U.S. Pat. No. 7,737,411, and U.S. Published Application Nos. 20070215900 and 20100295095.

SUMMARY OF THE INVENTION

According to an aspect of some embodiments of the present invention there is provided a light detection system. The system comprises a light absorbing layer made of a semiconductor having majority carriers and minority carriers, and being incorporated with bandgap modifying atoms at a concentration selected so as to allow generation of photocurrent indicative of absorption of photons at any wavelength at least in the range of from about 3 µm to about 5 µm.

According to some embodiments of the invention the light absorbing layer comprises InAsN.

According to some embodiments of the invention the light absorbing layer comprises InAsSbN.

According to some embodiments of the invention the system further comprising a barrier layer, adjacent to the light absorbing layer and having a semiconductor configured for providing a barrier to the majority carriers.

According to some embodiments of the invention the barrier layer comprises a III-V semiconductor.

According to some embodiments of the invention the system further comprising a contact layer made of an n-doped semiconductor and being adjacent to the barrier layer at an opposite side to the light absorbing layer.

According to some embodiments of the invention the contact layer comprises a III-V semiconductor According to some embodiments of the invention the contact layer comprises InAs.

According to some embodiments of the invention the system further comprises a contact layer made of a p-doped semiconductor and being adjacent to the barrier layer.

According to some embodiments of the invention the system is configured to operate in a background limited condition for a background temperature of 300 K, while a temperature of the light absorbing layer is at least 150K.

According to some embodiments of the invention the concentration of the bandgap modifying atoms is at least 0.1%.

According to an aspect of some embodiments of the present invention there is provided a light detection system. The system comprises a light absorbing layer made of a semiconductor having majority carriers and minority carriers, and being incorporated with bandgap modifying atoms selected from the group consisting of nitrogen and bismuth at a concentration of at least 0.1%.

According to an aspect of some embodiments of the present invention there is provided a method of detecting light. The method comprises causing a light to interact with a light detection system having a light absorbing layer made of a semiconductor having majority carriers and minority carriers, and being incorporated with bandgap modifying atoms selected from the group consisting of nitrogen and bismuth at a concentration of at least 0.1%.

According to some embodiments of the invention the method further comprises maintaining a temperature of the light absorbing layer at a temperature of at least 150K while operating the light detection system at background temperature of 300 K.

According to an aspect of some embodiments of the present invention there is provided a method of fabricating a light detection system. The method comprises: growing on a substrate a light absorbing layer made of a semiconductor having majority carriers and minority carriers and being incorporated with bandgap modifying atoms at a concentration selected so as to allow generation of photocurrent indicative of absorption of photons at any wavelength within a predetermined range.

According to some embodiments of the invention the bandgap modifying atoms comprise nitrogen atoms.

According to some embodiments of the invention the bandgap modifying atoms comprise bismuth atoms.

According to some embodiments of the invention the semiconductor is an n-type semiconductor so that the majority carriers are electrons and the minority carriers are holes.

According to some embodiments of the invention the light absorbing layer comprises a III-V semiconductor.

According to some embodiments of the invention the method further comprising growing on the light absorbing layer a barrier layer having a semiconductor configured for providing a barrier to the majority carriers.

According to some embodiments of the invention the barrier layer comprises a III-V semiconductor.

According to some embodiments of the invention the method further comprising growing on the barrier layer a contact layer made of an n-doped semiconductor.

According to some embodiments of the invention the contact layer comprises a III-V semiconductor.

According to some embodiments of the invention the method further comprising growing on the barrier layer a contact layer made of a p-doped semiconductor and being adjacent to the barrier layer at an opposite side to the light absorbing layer.

According to some embodiments of the invention the growing the light absorbing layer is effected by MOCVD.

According to some embodiments of the invention the growing the light absorbing layer is effected by a process selected from the group consisting of Molecular Beam Epitaxy (MBE) and metal organic MBE.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

FIG. 1 is a schematic illustration of a light detection system, in embodiments of the invention in which a barrier layer is employed.

FIG. 2 is a schematic illustration of a bandgap diagram of the system of FIG. 1, for an nBn structure;

FIG. 3 is a schematic illustration of a bandgap diagram of the system of FIG. 1, in an embodiment in which the light absorbing layer comprises an n-type semiconductor alloy and the contact layer comprises a p-type semiconductor alloy.

FIG. 4 is a schematic illustration of a light detection system, in embodiments of the invention in which the system is a photovoltaic p-n junction.

FIG. 5 is a is a schematic illustration of a bandgap diagram of the system of FIG. 4, for a photovoltaic p-n junction in which the light absorbing layer comprises a n-type semiconductor alloy.

FIG. 6 is a flowchart diagram illustrating a method suitable for fabricating a light detection system, according to some embodiments of the present invention.

FIG. 7A shows PL spectra at 77 K taken from as-grown samples of single $GaIn_{0.25}AsN/GaAs$ quantum wells (QWs) with different well widths, as obtained during experiments performed in accordance with some embodiments of the present invention. The inset shows the measured wavelength peak and the PL FWHM versus QW thickness.

FIG. 7B shows PL intensity at 77 K as a function of excitation power for a 13 Å GaInAsN/GaAs single QW, as obtained during experiments performed in accordance with some embodiments of the present invention. The PL peak intensity as a function of excitation power is shown in the inset.

FIG. 8A shows In and N concentration profiles deduced from TOF-SIMS measurements for two GaInAsN/GaAs QW structures consisting of 13 Å (left peak) and 56 Å (right peak) well widths, as obtained during experiments performed in accordance with some embodiments of the present invention.

FIG. 8B shows N peak area (nm×%) as a function of nominal well width, as obtained during experiments performed in accordance with some embodiments of the present invention.

FIG. 8C shows average N concentration in the QWs and N:In FWHM ratio as function of the nominal QW thickness, as obtained during experiments performed in accordance with some embodiments of the present invention.

Figure 8:
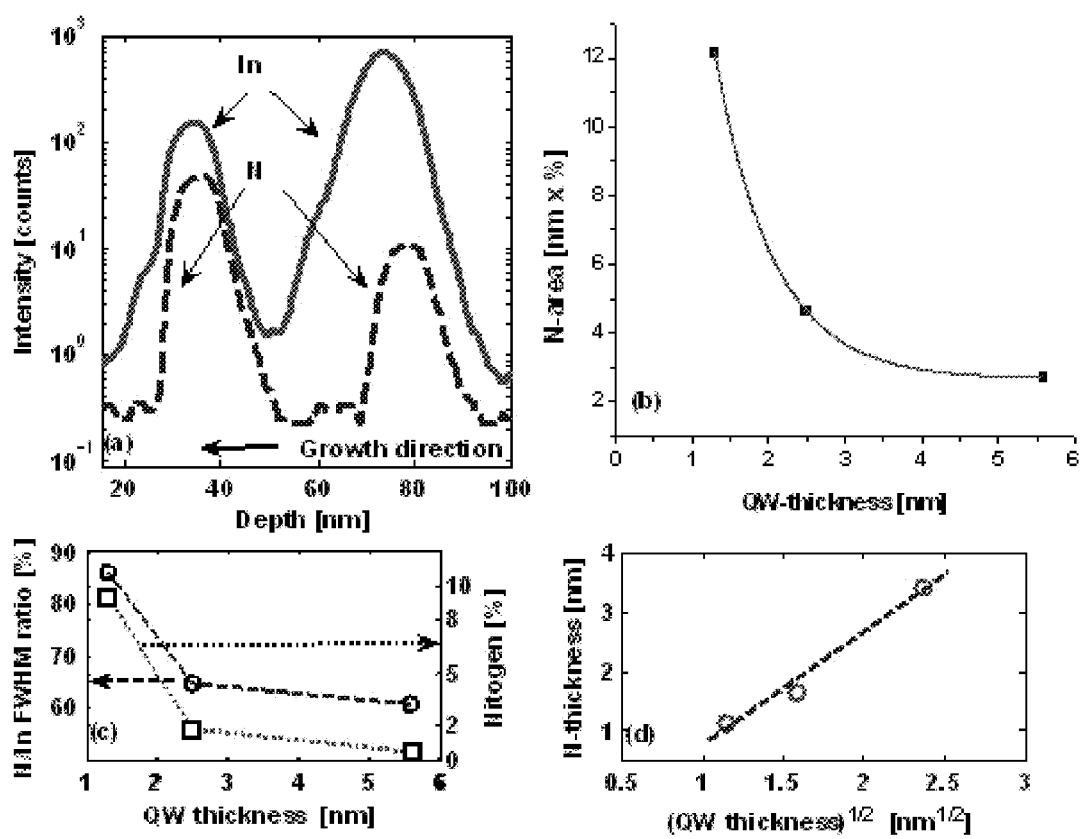

FIG. 8D shows normalized N thickness as function of square root of the QW thickness, as obtained during experiments performed in accordance with some embodiments of the present invention.

Figure 9:
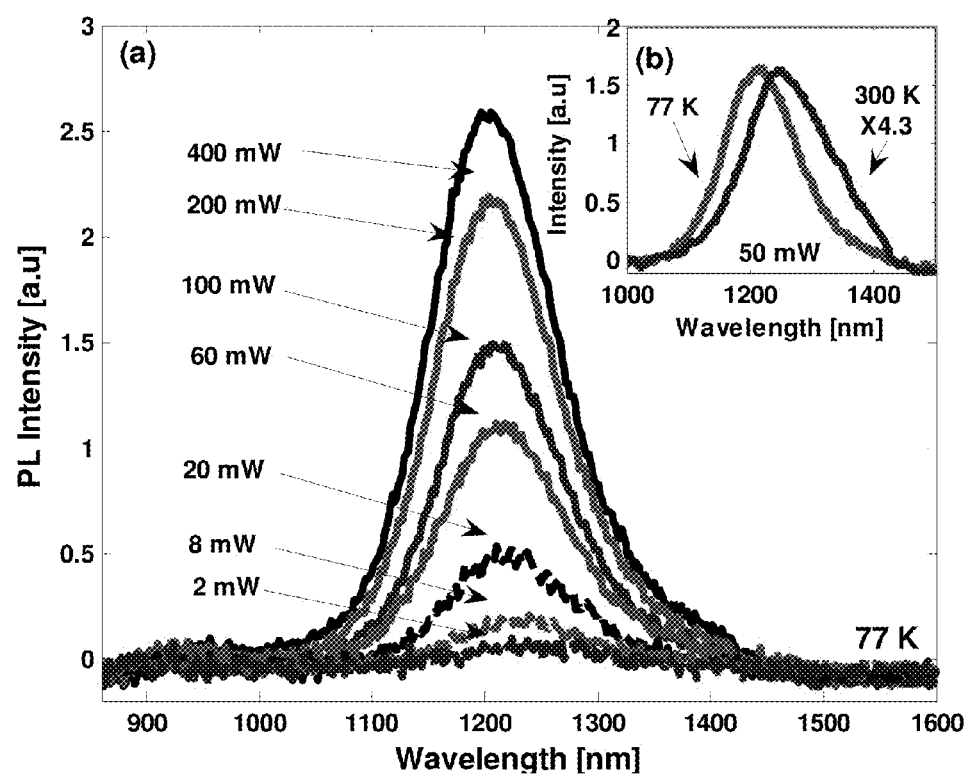

FIG. 9A shows PL spectra at 77 K of a QW sample grown using the two-step constant flow technique: the first step=10 Å with a low DMHy flow, and the second step with high DMHy flow, as obtained during experiments performed in accordance with some embodiments of the present invention.

FIG. 9B shows PL spectra at 77 and 300 K, as obtained during experiments performed in accordance with some embodiments of the present invention.

Figure 10:
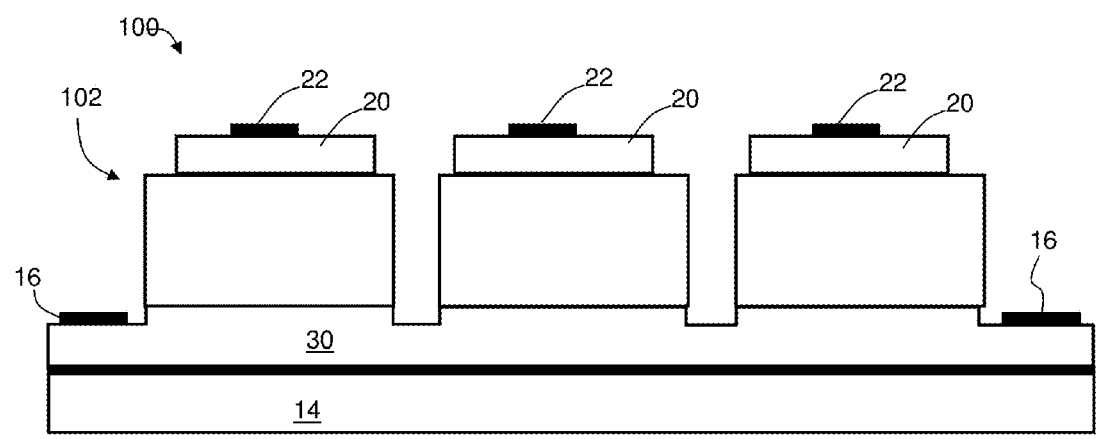

FIG. 10 is a schematic illustration of a light detection system which comprises a plurality of light detecting units, according to various exemplary embodiments of the present invention.

DESCRIPTION OF SPECIFIC EMBODIMENTS OF THE INVENTION

The present invention, in some embodiments thereof, relates to photodetection and, more particularly, but not exclusively, to the detection of by an active region which comprises bandgap modifying atoms.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

The present embodiments comprise a light absorbing layer made of a semiconductor which has majority carriers and minority carriers, and which is additionally incorporated with bandgap modifying atoms, such as, but not limited to, nitrogen (N) atoms or bismuth (Bi) atoms. Bi primarily affects the states in the vicinity of the top of the valence band and N primarily affects the states in the bottom of the conduction band.

While the light absorbing layer is described herein as incorporating the bandgap modifying atoms, the final layer typically comprises the bandgap modifying atom at its alloyed form. For example, when the bandgap modifying atom is nitrogen, it is incorporated into the layer it is in its dilute-nitride from, and when the bandgap modifying atom is bismuth it is incorporated into the layer it is in its bismide from.

It was found by the inventors of the present invention that the incorporation of bandgap modifying atoms in the light absorbing layer can be used for setting the characteristic cutoff absorption wavelength of the layer. It was unexpectedly found by the present inventor that the incorporation of bandgap modifying atoms has a synergistic effect whereby a low concentration of the bandgap modifying atoms is sufficient for significantly altering the characteristic cutoff absorption wavelength.

In various exemplary embodiments of the invention the concentration of the bandgap modifying atoms is preferably selected so as to allow generation of photocurrent indicative of absorption of photons at any wavelength within a predetermined range of wavelengths. Typically, but not necessarily, the predetermined range of wavelengths is in the mid-wavelength infrared (MWIR) range. In various exemplary embodiments of the invention the predetermined range is at least from about 3 μm to about 5 μm (i.e., from about $\lambda_1$ to about $\lambda_2$, $\lambda_1 \leq 3$ μm and $\lambda_2 \geq 5$ μm). Other ranges of wavelengths are not excluded from the scope of the present invention, for example, in some embodiments of the present invention the predetermined range extends up to 6 μm (e.g., from 3 μm to 6 μm), and in some embodiments the predetermined range extends to 1.7 μm (e.g., from about 1.7 μm to about 5 μm or from about 1.7 μm to about 6 μm). In some embodiments the predetermined range is from about 1.7 μm to about 3 μm. A particular advantageous range is from about 3 μm to about 5 μm since the atmosphere is generally transparent to almost any wavelength in this range (except, perhaps at several wavelengths corresponding to absorption lines of some molecules, such as water and carbon dioxide).

While the embodiments below are described with a particular emphasis to Mid-IR wavelength photons, it is to be understood that more detailed reference to Mid-IR wavelength photons is not to be interpreted as limiting the scope of the invention in any way. In some embodiments of the present invention the light absorbing layer detects visible and/or UV light.

In some embodiments of the present invention the concentration of the bandgap modifying atoms is at least 0.1%, or from about 0.1% to about 5%, or from about 0.1% to about 4%, or from about 0.1% to about 3%, or from about 0.1% to about 2%, or from about 0.5% to about 2%, or from about 0.5% to about 1.5%. Other concentrations are not excluded from the scope of the present invention.

The light absorbing layer of the present embodiments can comprise any semiconductor compound or alloy having a bandgap between a conduction band and a valence band, which bandgap is suitable for allowing absorbing of photons at a wavelength with the predetermined range and generating a photocurrent in response. The semiconductor alloy can be an n-type semiconductor, in which case the majority carriers are electrons and the minority carriers are holes, or a p-type semiconductor, in which case the majority carriers are holes and minority carriers are electrons.

In various exemplary embodiments of the invention the semiconductor compound is a III-V semiconductor alloy, namely an alloy which comprises at least one element from group III of the periodic table and at least one element which comprises V of the periodic table. Exemplary useful group-III elements include, but are not limited to, gallium, indium, thallium and aluminum; and exemplary useful group-V elements include, but are not limited to, arsenic, antimony and phosphorous Non-limiting examples of III-V semiconductor alloys suitable for the present embodiments include binary III-V semiconductor alloys, such as, but not limited to, InAs, InSb, InP GaSb, GaAs and AlSb, ternary III-V semiconductor alloys such as, but not limited to, InGaAs, InAsSb, InAsP, AlInAs, AlAsSb, GaAsP and InSbP, and quaternary semiconductor alloys such as, but not limited to, GaInAsSb.

In some embodiments of the present invention II-VI semiconductor alloys, in which case the bandgap modifying atoms are preferably oxygen.

When the light absorbing layer of the present embodiments comprises nitrogen as the bandgap modifying atom, the corresponding III-V semiconductor alloy can be selected from the group consisting of InAsN, InSbN, InPN, InGaAsN, InGaAsSbN InAsSbN, InAsPN, InSbPN, GaSbN, AlSbN, AlInSbN, AlInGaPN and InGaAsPN.

When the light absorbing layer of the present embodiments comprises bismuth as the bandgap modifying atom, the corresponding III-V semiconductor alloy can be selected from the group consisting of GaAsBi, InAsBi, InSbBi and InAsSbBi.

In various exemplary embodiments of the invention the light absorbing layer is incorporated in a light detection system. This can be done in more than one way, as will now be explained with reference to the drawings.

Figure 1:
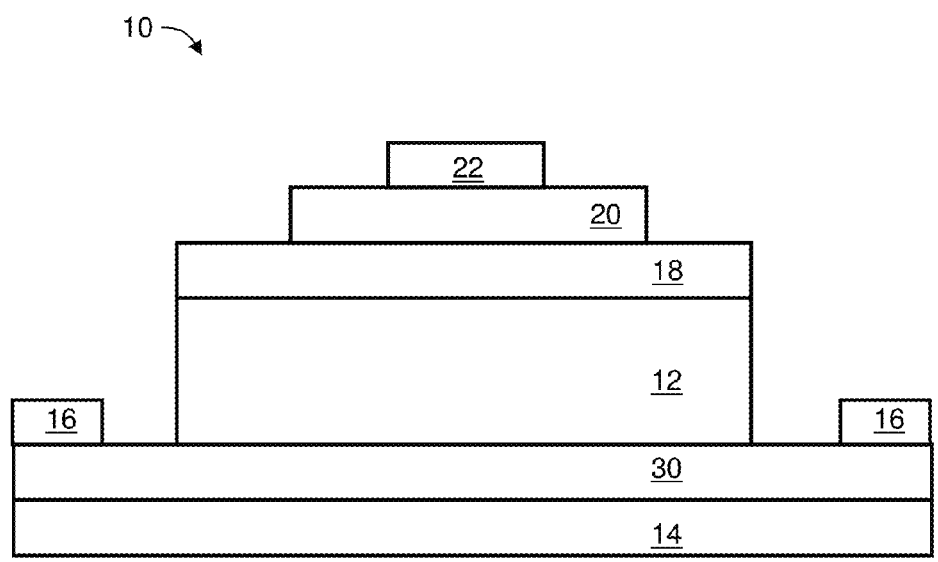

FIG. 1 is a schematic illustration of a light detection system, in embodiments of the invention in which a barrier layer is employed. Shown in FIG. 1 is a light detection system 10 which comprises a light absorbing layer 12 on a substrate 14. In some embodiments of the present invention system 10 also comprises a first contact layer 30 between layer 12 and substrate 14. At least some of the properties of layer 12 are preferably the same as those described above. Thus, in various exemplary embodiments of the invention light absorbing layer 12 comprises a semiconductor alloy (e.g., a III-V semiconductor alloy) incorporated with bandgap modifying atoms (e.g., nitrogen atoms or bismuth atoms), as further detailed hereinabove. The thickness of layer 12 is preferably on the order of the characteristic optical absorption length of the respective photons (e.g., from about one to about two times the optical absorption length).

Layer 30 serve for establishing ohmic contact and is typically doped more heavily than layer 12. A contact pad layer or metal layer 16, for connection to electronic circuitry (not shown), is deposited, preferably on contact layer 30 as shown in FIG. 1.

Substrate 14 serves as a base for the epitaxial growth of layers thereon, and can be made of any semiconductor material suitable for growing the layers thereon. For example, when layer 12 is made of InAsSbN substrate 14 can comprise GaSb, GaAs, or InP, when layer 12 is made of InAsN substrate 14 can comprise InAs.

Substrate 14 is preferably transparent to light at wavelengths within the aforementioned predetermined range of wavelengths.

Optionally and preferably system 10 comprises a barrier layer 18, adjacent to light absorbing layer 12. Thus, light absorbing layer 12 is between barrier layer 18 and substrate 14. Barrier layer 18 comprises a semiconductor which provides a barrier to the majority carriers (electrons when layer 12 comprises an n-type semiconductor, and holes when layer 12 comprises a p-type semiconductor). Barrier layer 18 is grown onto layer 12 to a thickness sufficient to substantially prevent tunneling of majority carriers out of layer 12 through layer 18. In an exemplary embodiment, barrier layer is deposited to a thickness of from about 50 to about 100 nm.

In various exemplary embodiments of the invention barrier layer 18 substantially lattice-matches light absorbing layer 12. The lattice matching is such that barrier layer 18 exhibits a high band gap barrier for the majority carriers from light absorbing layer 12 and substantially no band gap barrier for the minority carriers. For example, for a light absorbing layer which comprises an n-type semiconductor, the band gap difference appears in the conduction band, whereas substantially no band gap offset appears in the valence band. Conversely, for a light absorbing layer which comprises a p-type semiconductor, the band gap difference appears in the valence band, whereas substantially no band gap offset appears in the conduction band. Such configuration reduces or prevents flow of thermalized majority carriers over the barrier.

Thus, barrier layer 18 is sufficient to block both the flow of thermalized and photo excited majority carriers and the tunneling of majority carriers out of light absorbing layer 12.

Barrier layer 18 can be made of an n-type semiconductor or a p-type semiconductor. In various exemplary embodiments of the invention barrier layer 18 comprises or is made of a III-V semiconductor alloy. Non-limiting examples of III-V semiconductor alloys suitable for barrier layer 18 include binary III-V aluminum-containing semiconductor alloys, such as, but not limited to, AlSb, ternary III-V aluminum-containing semiconductor alloys such as, but not limited to, AlAsSb and AlPSb, and quaternary III-V aluminum-containing semiconductor alloys such as, but not limited to, GaAlAsSb and AlGaPSb.

A representative and non-limiting example of lattice-matching between light absorbing layer 12 and barrier layer 18 include a light absorbing layer which made of an n-doped $InAs_{1-y}N_y$, with a nitrogen concentration y of 0.1 to 2%, and a barrier layer which is made of $AlAs_xSb_{1-x}$, where x is from about 0.15 to about 0.2. Such combination provides a practically zero valence band offset. Another representative and non-limiting example includes a light absorbing layer which made of an n-doped $InAs_{1-y-x}Sb_{y-x}N_x$, and a barrier layer which is made of $AlAs_zSb_{1-z}$, where y is about 0.09, x is from about 0.001 to about 0.02, and z about 0.09.

As used herein "practically zero valence band offset" refers to an valence band offset which is less than 1 kT, where k is the Boltzmann constant and T is the temperature of the layers.

One of ordinary skills in the art, provided with the details described herein would know how to ensure lattice matching between the light absorbing layer and the barrier layer for a semiconductor alloys other than the aforementioned InAsN/AlAsSb and InAsSbN/AlAsSb combinations.

In various exemplary embodiments of the invention system 10 comprises a contact layer 20 adjacent to barrier layer 18 at an opposite side to light absorbing layer 12. Thus, barrier layer 18 is between light absorbing layer 12 and contact layer 20. Contact layer 20 may have grown on its opposite face a contact pad or metal layer 22 for connection to electronic circuitry (not shown). During operation of system 10, a potential difference is applied to contact pads 16 and 22 such that minority carriers (holes when layer 12 comprises an n-type semiconductor and electrons when layer 12 comprises a p-type semiconductor) flow out of light absorbing layer 12, pass barrier layer 18 and enter contact layer 20. The majority carriers flow out of layer 12 in the opposite direction. Thus, contact layer 20 is configured to receive minority carriers passing through barrier layer 18 away from layer 12.

In various exemplary embodiments of the invention contact layer 20 comprises or is made of a III-V semiconductor alloy. Non-limiting examples of III-V semiconductor alloys suitable for contact layer 20 include binary and ternary III-V semiconductor alloys such as, but not limited to, InAs, InGaAs, InAsSb, Type II super lattice InAs/InGaSb. Also contemplated are II-VI semiconductor alloys, such as, but not limited to, the quaternary $Zn_{1-y}Mn_yO_xTe_{1-x}$ which is useful for the visible and UV light.

Although the schematic illustration of FIG. 1, shows layer 12 between substrate 14 and layer 18, this need not necessarily be the case since other configurations are not excluded. For example, in some embodiments of the present invention the location of layers 12 and 20 can be interchanged, thus forming a system in which the contact layer 20 is between substrate 14 and barrier layer 18, while the light absorbing layer 12 is adjacent to barrier layer 18, but at a side opposite to layer 20. In this configuration, it is not necessary for substrate 14 to be transparent to light.

When the system is used for imaging, a 2D matrix of elements that is attached to a 2D Si read out (face to face, where each element of the 2D detector is connected to first stage read out element on Si read out chip) which is not necessarily transparent. A representative example of a system which comprises such arrangement is shown in FIG. 10.

The structure of system 10 wherein the light absorbing layer and the contact layer are separated by a barrier layer is advantageous since it significantly improves the signal to noise ratio by reducing or elimination flow of majority carriers (either by tunneling or by thermal excitation) through or over the barrier, thereby allowing flow of majority carriers essentially in one direction (from layer 12 to contact pad 16, in the present example). The nBn photodetector (n-type active layer, widegap Barrier, n-type contact layer) is an advanced photodetector structure which reduces or eliminates dark current arising from Shockley-Read-Hall generation-recombination mechanisms and from the flow of majority carriers, and it also effectively suppresses surface leakage currents.

Thus, compared to a similar system but without a barrier, system 10 is operative at a higher temperature with the same performance or it can provide better performance than at the same temperature. In various exemplary embodiments of the invention system 10 produces a detectable photocurrent sufficiently above the background noise at a temperature which is above 130K or above 140K or above 150K, e.g., 160K or more. System 10 preferably operates in a background limited condition for a background temperature of 300 K, while a temperature of the light absorbing layer is at least 130K or above 140K or above 150K, e.g., 160K or more.

As used herein Background Limited Infrared Performance (BLIP) system is a system in which the dominant noise is from the background flux.

The present aspect of the invention contemplates embodiments in which the characteristic bandgap of contact layer 20 is the same as in light absorbing layer 12, and alternative embodiments in which the characteristic bandgap of contact layer 20 differs than that of light absorbing layer 12. These embodiments are further detailed below.

Generally, layers 12 and 20 can comprise semiconductor alloys of the same impurity type (namely both of n-type or both of p-type) or different impurity types. Specifically, each of the following four combinations is contemplated: (i) both layers 12 and 20 comprise an n-type semiconductor alloy, (ii) both layers 12 and 20 comprise a p-type semiconductor alloy, (iii) layers 12 comprises an n-type semiconductor alloy and layer 20 comprises a p-type semiconductor alloy, and (iv) layers 12 comprises a p-type semiconductor alloy and layer 20 comprises an n-type semiconductor alloy. All these combinations are collectively referred to herein as XBn or XBp structures, where n and p indicate an n-type or p-type contact layer, B indicates a barrier layer and "X" indicates an n-type or p-type light absorbing layer with a characteristic bandgap which may or may not be the same as the that of the contact layer.

In the embodiments in which the characteristic bandgap of contact layer 20 is approximately the same (e.g., within 10%) as in light absorbing layer 12, both layers 12 and 20 preferably comprise a semiconductor alloy of the same type. Specifically, in these embodiments both layers 12 and 20 comprise an n-type semiconductor alloy or both layers 12 and 20 comprise a p-type semiconductor alloy, the former being referred to herein as an "nBn" structure, and the latter being referred to herein as a "pBp" structure. In various exemplary embodiments of the invention layers 12 and 20 comprise identical semiconductor alloy compositions except that layer 12 comprise in addition, bandgap modifying atoms as further detailed hereinabove. In some embodiments of the present invention layer 20 also includes bandgap modifying atoms.

Figure 2:
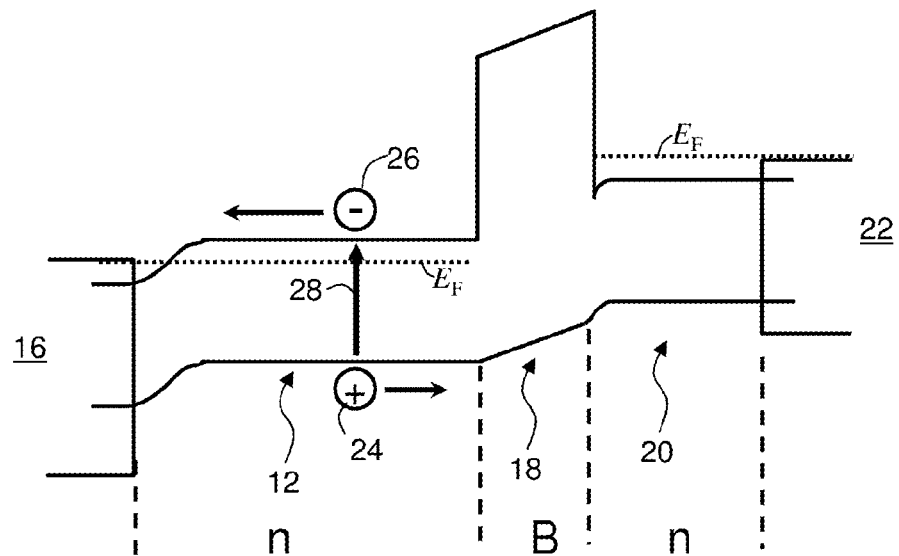

A representative example of a bandgap diagram of system 10 for an nBn structure is provided in FIG. 2. Pictorially illustrated in FIG. 2 is an optical excitation (i.e., the absorption of a photon) resulting in the generation 28 of a hole-electron pair comprising a hole 24 and an electron 26 in layer 12. The quasi Fermi levels $E_f$ of layers 12 and 20 are indicated in FIG. 2 by dotted lines. Since FIG. 2 corresponds to a structure in which layer 12 comprises an n-type semiconductor alloy, the majority carriers are electrons and the minority carriers are holes. Thus, barrier layer 18 prevents or reduces the flow electron 26 through it, but allows the flow of hole 24 into contact layer 20. Thus, upon application of a potential difference between contact pad 16 and contact pad 22, electron 26 moves toward contact pad 16, and hole 24 moves, through barrier layer 18 and contact layer 20 toward contact pad 22. The photocurrent so generated by the optical excitation is sensed by an electronic circuit (not shown). Although a bandgap diagram for a pBp structure is not explicitly drawn for conciseness, the ordinarily skilled person provided with the details described herein would know how to adjust FIG. 2 for the case of pBp structure.

In the embodiments in which the characteristic bandgaps of contact layers 20 and 12 differ, it is not necessary for layers 12 and 20 to have a semiconductor alloy of the same type. Yet, structures in which layers 12 and 20 comprise a semiconductor alloy of the same type but with different bandgaps are not excluded from the scope of the present invention.

Figure 3:
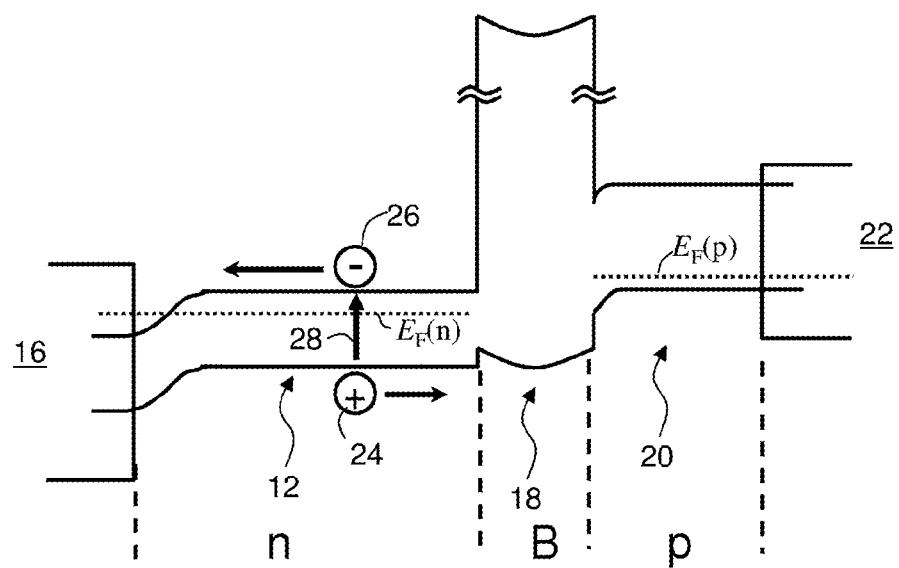

A representative example of a bandgap diagram of system 10 for the case in which the light absorbing layer comprises an n-type semiconductor alloy and the contact layer comprises a p-type semiconductor alloy is provided in FIG. 3. For example, layer 12 can comprise an n-type InAsSbN, layer 18 can comprise AlSbAs (lattice matched to layer 12), and layer 20 can comprise a p-type GaSb. In some embodiments of the present invention contact layer 20 is a p-type $InAs_{0.91}Sb_{0.09}$ which has wider band gap than InAsSbN and lattice matched to the substrate GaSb.

Pictorially illustrated in FIG. 3 is an optical excitation resulting in the generation 28 of a hole-electron pair comprising a hole 24 and an electron 26 in layer 12. The quasi-Fermi levels $E_f$ of the (n-type) layer 12 and the (p-type) layer 20 are indicated in FIG. 3 by dotted lines. Since FIG. 3 corresponds to a structure in which layer 12 comprises an n-type semiconductor alloy, the majority carriers are electrons and the minority carriers are holes. Thus, barrier layer 18 prevents or reduces the flow electron 26 through it, but allows the flow of hole 24 into contact layer 20. Thus, upon application of a potential difference between contact pad 16 and contact pad 22, electron 26 moves toward contact pad 16, and hole 24 moves, through barrier layer 18 and p-type contact layer 20 toward contact pad 22. The photocurrent so generated by the optical excitation is sensed by an electronic circuit (not shown). Although bandgap diagrams for other structures of different bandgaps are not explicitly drawn for conciseness, the ordinarily skilled person provided with the details described herein would know how to adjust FIG. 3 for such structures.

Figure 4:
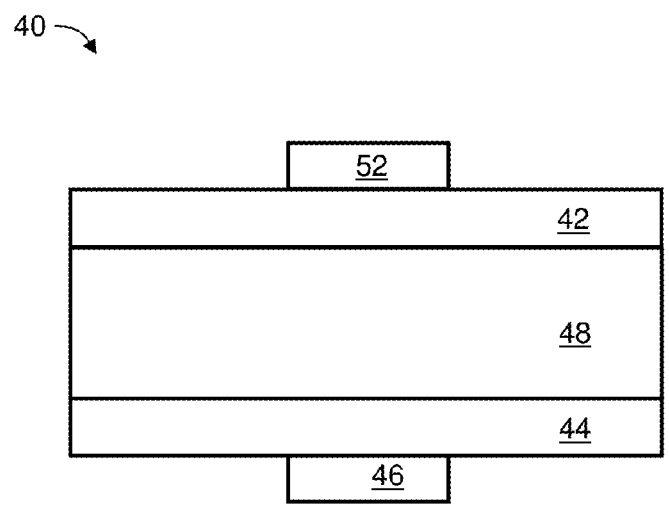

While the embodiments above were described with a particular emphasis to a light detection system which comprises a barrier (an XBn or XBp structure), it is to be understood that more detailed reference to such structure is not to be interpreted as limiting the scope of the invention in any way. FIG. 4 is a schematic illustration of a light detection system, in embodiments of the invention in which the system is a photovoltaic p-n junction without a barrier layer.

Shown in FIG. 4 is a light detection system 40 which comprises a first layer 48 and a second layer 42 on a substrate 44. Layer 48 can serve as a light absorbing layer, in which case at least some of its properties are the same as the respective properties of the light absorbing layer described above. Thus, in various exemplary embodiments of the invention light absorbing layer 48 comprises a semiconductor alloy (e.g., a III-V semiconductor alloy) incorporated with bandgap modifying atoms (e.g., nitrogen atoms or bismuth atoms), as further detailed hereinabove. The thickness of layer 48 is preferably on the order of the characteristic optical absorption length of the respective photons (e.g., from about one to about two times the optical absorption length).

Connection of system 40 to electronic circuitry can be established by means of metallic contacts 46 and 52 which can be deposited directly on the layers or on doped semiconductor contact layers (not shown) to facilitated ohmic contact.

Layers 42 and 48 comprise semiconductor alloys of different type such as to form a heterojunction between layer 48 and layer 42. Specifically, in some embodiments layer 42 comprises an n-type semiconductor alloy and layer 48 comprises a p-type semiconductor alloy, and in some embodiments layer 42 comprises a p-type semiconductor alloy and layer 48 comprises an n-type semiconductor alloy. Each of these structures is referred to herein as "a photovoltaic p-n junction". In the schematic and non-limiting illustration of FIG. 4, layer 48 is between substrate 44 and layer 42, but this need not necessarily be the case since the opposite configuration (layer 42 between substrate 44 and layer 48) is not excluded.

In some embodiments of the invention layer 48 lattice-matches layer 42. In some embodiments layer 48 is strained, but preferably below the critical thickness. Thick layer above the critical thickness induces defects that affect strongly the device performance. In general there is an advantage to heterostructure pn junction due to lower dark current characteristics. Optionally and preferably layers 48 and 42 comprise generally the same semiconductor alloy composition (albeit, as stated, with opposite impurity types), except that the light absorbing layer is incorporated with bandgap modifying atoms as further detailed hereinabove. In some embodiments of the present invention both layers are incorporated with bandgap modifying atoms.

A representative and non-limiting example of lattice-matching between layer 48 and layer 42 include a light absorbing layer which made of an n-doped $InAs_{1-y-x}Sb_yN_x$ with Sb concentration y of 0.09 and a nitrogen concentration x from about 0.001 to about 0.02, and a p type contact layer 42 which is made of $InAs_{1-y-z}Sb_{y-z}N_z$ where y is about 0.09 and z from about 0.001 to about 0.02. Such combination provides a practically homo junction or heterojunction without the barrier that described above. In case that x=z the structure is a simple tunable pn junction, and in case z=0 or z<x the structure is a tunable nP heterojunction. In other embodiments an $InAs_{1-x}N_x$/InAs nP heterojunction can be grown on a InAs substrate, where x is from about 0.001 to about 0.02.

Substrate 44 serves for the growth of layer 48 (or layer 42 as the case may be) on it and preferably has grown on its opposite face a contact layer and deposited metal layer 46 for connection to electronic circuitry (not shown). Substrate 44 can be made of any material suitable for growing the layers thereupon. For example, when layer 48 is made of InAsSb substrate 44 can comprise GaSb, when layer 48 is made of InAsSbN substrate 44 can comprise InP and when layer 48 is made of InAsN substrate 44 can comprise InAs.

Figure 5:
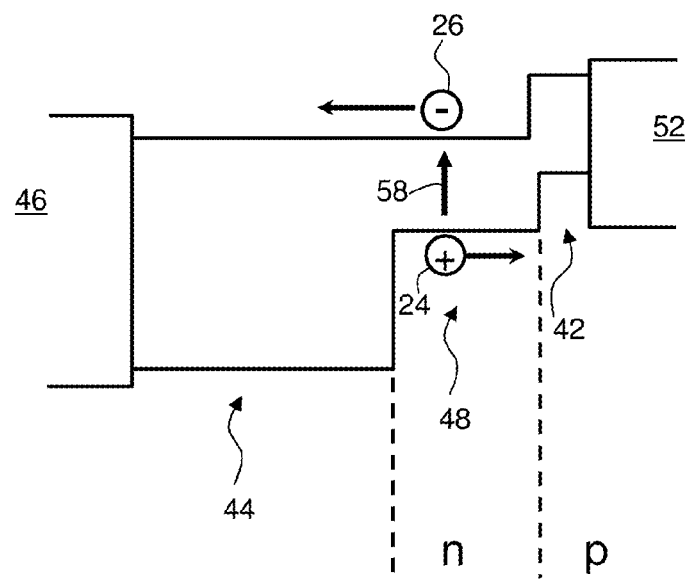

A representative example of a bandgap diagram of system 40 for a photovoltaic p-n junction in which layer 42 comprises a p-type semiconductor alloy and layer 48 comprises n-type semiconductor alloy is provided in FIG. 5.

As illustrated, an optical excitation (i.e., the absorption of a photon) results in the generation 58 of a hole-electron pair comprising a hole 24 and an electron 26. Under the influence of the depletion region at the junction, electron 26 moves toward contact pad 46, and hole 24 moves toward contact pad 52. The photocurrent so generated by the optical excitation is sensed by an electronic circuit (not shown). Although a bandgap diagram for a structure in which the thicker layer comprises a p-type semiconductor alloy is not explicitly drawn for conciseness, the ordinarily skilled person provided with the details described herein would know how to adjust FIG. 5 for such a case.

Figure 6:
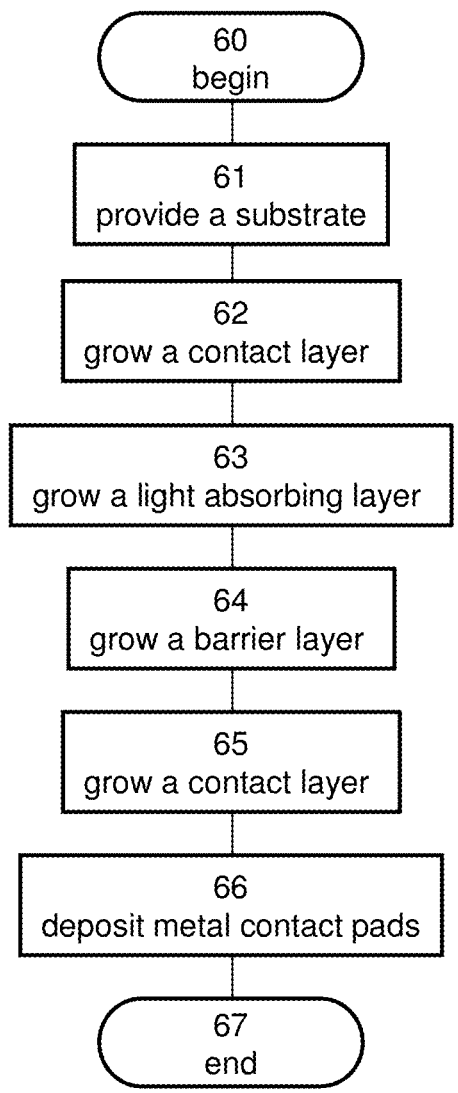

Reference is now made to FIG. 6 which is a flowchart diagram illustrating a method suitable for fabricating a light detection system, according to some embodiments of the present invention. The method is particularly useful for fabricating system 10 or system 40 described above. It is to be understood that, unless otherwise defined, the operations described hereinbelow can be executed either contemporaneously or sequentially in many combinations or orders of execution. Specifically, the ordering of the flowchart diagrams is not to be considered as limiting. For example, two or more operations, appearing in the following description or in the flowchart diagrams in a particular order, can be executed in a different order (e.g., a reverse order) or substantially contemporaneously. Additionally, several operations described below are optional and may not be executed.

The method begins at 60 and continues to 61 at which a substrate, such as, but not limited to, substrate 14 or substrate 44 is provided. The method optionally and preferably continues to 62 at which a first contact layer is grown on substrate 44. The contact layer can be grown using any deposition technique known in the art including, without limitation, chemical vapor deposition CVD, e.g., metal organic CVD (MOCVD), or Molecular Beam Epitaxy (MBE) or metal organic MBE (MO-MBE). Optionally, atomic layer epitaxy (ALE) is implemented. Some techniques suitable for the present embodiments are described in U.S. Published Application No. 2010 0301306, the contents of which are hereby incorporated by reference. The contact layer can comprise any semiconductor alloy (e.g., a III-V or II-VI semiconductor alloy) suitable for growing on the substrate.

When the method is executed for the fabrication of an active region of an imaging system, the contact layer is preferably sufficiently large so as to allow growing thereon a 2D array or matrix of light absorbing elements.

The method continues to 63 at which a light absorbing layer, such as, but not limited to, layer 12 or layer 42 described above is deposited. In some embodiments of the present invention the light absorbing layer is grown directly on the contact layer (if exists) or the substrate (if 62 is not executed). In alternative embodiments the light absorbing layer is deposited on another layer, e.g., a barrier layer or a contact layer, as further detailed hereinbelow.

In various exemplary embodiments of the invention the light absorbing layer comprises a semiconductor (e.g., a III-V semiconductor alloy) and is incorporated with bandgap modifying atoms as further detailed hereinabove. The growth of a light absorbing layer incorporated with bandgap modifying atoms can be using any growth technique known in the art including, without limitation, CVD, e.g., MOCVD, or MBE or MO-MBE. A representative example for the deposition of a light absorbing layer suitable for the present embodiments is provided in the Examples section that follows.

Optionally and preferably the method continues to 64 at which a barrier layer (e.g., barrier layer 18) is grown. The barrier layer can be deposited directly onto the light absorbing layer or, on another layer, e.g., the first contact layer. Alternatively, when it is desired to fabricate a system without a barrier (e.g., a system such as system 40 which is based on a photovoltaic p-n junction), no barrier layer is grown.

The barrier layer can be grown using any deposition technique known in the art including, without limitation, any of the aforementioned deposition techniques.

At 65 a second contact layer (such as contact layer 20) is optionally and preferably grown. The second contact layer can be grown directly on the barrier layer (if exists) or directly on the light absorbing layer (if 64 is not executed). The contact layer can be grown using any deposition technique known in the art including, without limitation, any of the aforementioned deposition techniques.

In some embodiments of the present invention metal contact pads are deposited 66 at the both sides of the fabricated system, preferably following suitable processing, using lithographic and etching techniques as known in the art. For example, mesa etching can be employed so as to form a plurality of active regions laterally displaced from each other to form a 2D array or matrix. Each active region can include a system such as system 10 or 40 described above. This embodiment is particularly useful when the method is implemented for fabricating a light detection system for imaging. Preferably, but not necessarily, one of the contacts (typically the bottom contact) is common to all active regions.

The method ends at 67.

A representative example of a light detection system 100 which comprises a plurality of light detecting units 102 is illustrated in FIG. 10. System 100 comprises a carrier substrate, such as substrate 14, and a back contact layer, such as layer 30, grown on substrate 14. A two-dimensional array of light detecting units 102 is arranged on layer 30. Each of light detecting units 102 can be similar to system 10 or system 40. Each unit 102 comprises a front contact layer, such as layer 20, and a metal contact pad, such as contact pad 22.

The lateral dimensions of unit 102 (parallel to substrate 14) is typically about 20×20 $\mu m^2$. System 100 typically comprises about 100×500 light detecting units 102 arranged in a two-dimensional array.

As used herein the term "about" refers to ±10%.

The word "exemplary" is used herein to mean "serving as an example, instance or illustration." Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments." Any particular embodiment of the invention may include a plurality of "optional" features unless such features conflict.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible sub-ranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find experimental support in the following examples.

EXAMPLES

Reference is now made to the following examples, which together with the above descriptions illustrate some embodiments of the invention in a non limiting fashion.

In this example, GaInAsN/GaAs single quantum wells were grown using metal organic chemical vapor epitaxy at 500° C. Using time-of-flight secondary ion mass spectrometry and photoluminescence spectroscopy, the present inventors have demonstrated a 1-2 nm thick nitrogen-rich interfacial layer at the first interface grown. Without wishing to be bound by any particular theory, the inhomogeneous asymmetric distribution of nitrogen atoms along the growth direction is attributed to the dominance of surface kinetics, nonlinear dependence of N incorporation on In content, and the strain gradient effect on the effective diffusion of N.

GaInAsN dilute nitride alloys have been the subject of intense theoretical and experimental research efforts because of their unique physical properties, which have potential for use in a wide range of device applications. In particular, the possibility of achieving emissions at 1.3-1.55 μm is of great interest in laser applications for optical communication [M. Henini, Dilute Nitride Semiconductors (Elsevier, Oxford 2005); and A. Erol, Dilute III-V Nitride Semiconductors and Material Systems (Springer, Berlin, 2008)]. However, the growth of GaInAsN using metal organic chemical vapor deposition (MOCVD) is not straightforward.

One of the challenges in growing GaInAsN quantum wells (QWs) is the difficulty in incorporating N atoms into GaInAs QWs. The incorporation of N is superlinearly reduced with increasing In content in GaInAsN alloys. A low growth temperature and a high dimethylhydrazine (DMHy)/As mole fraction ratio, which results in a low III/As constraint, were heretofore needed to incorporate a reasonable amount of nitrogen into the lattice [Henini supra, Chap. 2, 6]. The optical quality of dilute nitrides has been shown to deteriorate with increasing N composition, and the present inventors have successfully devised a procedure which eliminate or reduces the effect of excess N.

Samples were grown on semi-insulating (001)-oriented GaAs substrates using a low-pressure (78 torr) MOCVD upside-down vertical reactor. The grown samples consisted of 1000 Å GaAs buffer layers grown at 750° C., followed by the growth of GaInAsN QWs at 500° C. On top of this layer, 500 Å GaAs caps were grown at a temperature of 750° C., which affected our as-grown state in a self-annealing process. For the growth, trimethylgallium (TMGa) and trimethylindium (TMIn) were used as the Group III sources and $AsH_3$ (10% solution in $H_2$), and trimethylantimony (TMSb) and constant flowing DMHy were used as the Group V sources. $H_2$ was used as the carrier gas.

Photoluminescence (PL) measurements were conducted at 77 K and 300 K using a cooled germanium photodetector and 10 mW HeNe or $Ar^+$ lasers as the excitation sources. PL analysis was performed using a conventional single band effective mass envelope function model based on the empirical data of the band-gap, effective mass, and energy lineup dependence on the N and In composition [Albo et al., Appl. Phys. Lett. 94, 093503 (2009)]. Time-of-flight secondary ion mass spectrometry (TOF-SIMS) results were recorded using an ION-TOF TOF.SIMS5 spectrometer, in the dual beam analysis mode. The N concentration was calibrated using an ion-implanted standard. Measurements were conducted using a 0.5 KeV ion beam energy to achieve a high depth resolution.

A set of GaInAsN/GaAs QWs with a nominal thickness of 13, 25, and 56 Å and a 25% In concentration were grown in constant flowing DMHy and TMIn by varying the growth duration of the GaInAsN QWs. The QW thickness and the In concentration were deduced by analyzing QWs that were grown under identical growth conditions but without flowing DMHy using PL, high resolution X-ray diffraction (HRXRD), transmission electron microscopy (TEM), and TOF-SIMS techniques iteratively. Using these methods, it was also verified that no significant change in the thickness of the QWs and the In concentration occurred with the introduction of DMHy to the growth process.

FIGS. 7A-B shows the photoluminescence spectra at 77 K of the as-grown GaInAsN/GaAs QWs. Deviation from the expected behavior for equal and homogenous nitrogen composition QWs with varying thickness is depicted in the PL measurements, and can be seen in FIG. 7A. A clear red shift of the PL peak wavelength accompanied by a considerable increase in line width was observed with decreasing the QW thickness. These results are in contrast to the expected blue shift because of a higher quantum confinement in the narrow QWs and a line width narrowing with increasing wave function overlap with the binary barriers. Reducing the QW thickness from 56 to 13 Å increased the PL line width by a factor of six, from 41 to 241 meV, and the PL intensity decreased by a factor of 20.

The PL peak red shift, the increase in line width, and the decrease in intensity are consistent with an increase in average N concentration that occurs with a decrease in QW thickness, as will be verified below. Analyzing the PL data from the different thickness GaInAsN QWs using the effective mass envelope function model, as mentioned above, resulted in an average N concentration of 0.8%, 1.95%, and 4.2% for the 56, 25, and 13 Å QWs, respectively.

PL measurements at 77 K using different excitation levels of the 13 Å QW are shown in FIG. 7B. The spectra consist of two peaks: the dominant peak at the lowest laser excitation power, denoted as $P_D$, occurred at a wavelength of approximately 900 nm, and a second peak at longer wavelengths occurred at approximately 1200 nm and is denoted as $P_Q$. The $P_D$ peak is attributed to nitrogen-generated defect luminescence in the GaAs barrier [Buyanova, et al. Solid-State Electronics; 47, 467 (2003)]. The $P_Q$ peak is associated with the GaInAsN QW emission, as verified by the asymmetric line shape and the blue shift (for power <100 mW which are inherent characteristics of carrier localization in dilute nitride QWs [Henini supra chap 7].

The TOF-SIMS technique was used for depth profiling of the In and N concentrations to estimate the effect of the distribution of nitrogen on the QW's PL. FIG. 8a shows the depth profiles of In and N in two GaInAsN/GaAs QWs with well thicknesses of 13 and 56 Å. The measurements confirm that the In concentration was not affected by the use of flowing DMHy, and was indeed 25% in the 25 and 56 Å QWs, and slightly less, at 18%, in the 13 Å QW. Qualitatively, it is shown in FIG. 8a that the distributions of N and In do not overlap. While the leading edges of the N and In distributions do overlap, the N concentration falls to low values before the second interface of the QWs is reached.

The approximately exponential decrease in the N peak area in the SIMS profiles, shown in FIG. 8b, is attributed to desorption through the thickening GaInAs layer and indicates that the growth front moved faster than the broadening of the N distribution. In addition, it shows that the diffusion of N atoms is fast enough to allow desorption despite the ~1 nm GaInAs barrier. The diffusion mechanism will be further discussed below.

FIG. 8c shows the ratio between the widths of the N and In distribution as a function of well width and the average nitrogen concentration (N peak area/nominal QW width). The measured concentration by TOF-SIMS was 0.48%, 1.85%, and 9.34% for the 56, 25, and 13 Å QWs respectively. These concentrations are higher than the average values calculated from the PL results, but they displayed the same trend. A surprising result is the nonuniformity of the nitrogen distribution along the growth direction in the QWs. Even in the thinnest QW, it is noticeable (FIG. 8a) that the N atoms accumulate close to the first interface grown, where as in the thickest QW (56 Å) N atoms were only detected in the first 61% of the QW thickness.

Accumulation of nitrogen at GaInAsN/GaAs interfaces grown using molecular beam epitaxy MBE is known [Albrecht et al., Phys. Rev. Lett. 99, 206103 (2007); Litvinov et al., Appl. Phys. Lett. 85. 3743 (2004); and Chauveau et al., Appl. Phys. Lett. 84, 2503 (2004)]. Yet, there is a noticeable difference between the observations in these references and those at MOCVD-grown interfaces. In the first case, the accumulation is symmetrical at both interfaces, and the variation in the concentration is small compared to that in the MOCVD-grown interfaces fabricated according to some embodiments of the present invention, where the nitrogen concentration decays to a low value beyond that resolvable using SIMS at the second interface of the 56 Å QW.

The high concentration of nitrogen at the first interface explains the red shift in the PL peak position of the 25 and 13 Å QWs, which reflects the higher average nitrogen concentration in the narrowest QWs that, in turn, results in a reduction of the band gap that is stronger than the effect of quantum confinement. Furthermore, the present inventors found that the incorporation of N atoms is negligible when a thin buffer layer of GaInAs or GaAsSb (of the order of 9 Å) is grown between the first grown GaAs and GaInAsN QW interface. Therefore, it is concluded that this is a surface property which characterizes GaInAsN/GaAs interfaces grown using MOCVD at low temperatures.

The effective diffusion coefficient of N in GaInAs was estimated using first-order calculations assuming that the ratio between the FWHM of the N and In distributions is related to the integral effective diffusion using the following simple expression:

$$\frac{\Delta N(SIMS)}{\Delta In(SIMS)} \times (\text{nom\_QW\_width}) = \sqrt{D_{\text{eff}} t} \quad (1)$$

Taking into account the growth time of the GaInAsN layer, t=13, 27, and 54 s (as will be explained below), the effective diffusion coefficient was calculated as $D_{\text{eff}}$ (500° C.)=1.5× $10^{-15}$ cm²/s. This value is two orders of magnitude larger than the measured diffusion coefficient of N in GaAs at 500° C., as reported, for example, by Arif et al. [Erol supra chapter 19, 14]. If one assumes that the diffusion process occurs during the growth time of the cap at 750° C., then the calculated diffusion coefficient based on the N profile width of the 56 Å QW will be ~3×$10^{-16}$ cm²/s. This value is three orders of magnitude smaller than the calculated diffusion coefficient of N in GaAs at that temperature [Erol supra chapter 19, 14]. Moreover, unlike the case in the present example, in conventional techniques the equal growth times of the caps of all three QWs imply equal N distributions.

The exact solution of the diffusion profiles involves a nonlinear diffusion equation [Bosker et al., Phys. Rev. Lett. 81, 3443 (1998)]. This is because of desorption as well as a diffusion coefficient that depends on both the temperature and position, as can be deduced from FIG. 8A, where there is no noticeable N diffusion into the GaAs at the first interface. However, the present inventors found that for QWs thicker than 5.6 nm, where the N distribution is far from the growth front, the GaInAs layer eliminates any desorption, as shown by the asymptotic trend of the N width in FIG. 8B. In this range, the linear diffusion equation (1) is adopted. FIG. 8D demonstrates experimentally that equation (1) is applicable also for the thinner QWs.

The present inventors found that the N-rich interface is related to the surface kinetics and the gradient in the In concentration at the first interface. The extreme nonlinear dependence of the incorporation of N atoms on the In content in GaInAsN affects the N incorporation along the growth. The main driving force for the broadening of the N profile with QW width is the strain gradient, in addition to the desorption, and concentration gradient diffusion of N atoms. The dominance of the strain contribution over the concentration gradient is reflected by the high effective diffusion coefficient at 500° C. compared with the reported N diffusion in GaAs [Erol supra chapter 19, 14]. When the In flow was interrupted (i.e., reducing the change in strain to zero), the broadening of the N profile stopped in parallel. This was confirmed by the fact that there was no effect of barrier growth temperature (650 or 750° C.) in the N profile.

To achieve a higher average N concentration, as well as a better homogeneity, a two-step (low and high) DMHy flow process was developed by the present inventors. First, a QW was grown using the same constant DMHy flow rate as before, but after the first 10 Å of the QW was grown, the DMHy flow rate was increased to a constant value that was eight times higher than the initial value to compensate for the reduced nitrogen incorporation. The TOF-SIMS profile did not show an improvement in the nitrogen uniformity, but the average N concentration was increased to 2%.

Figure 7:
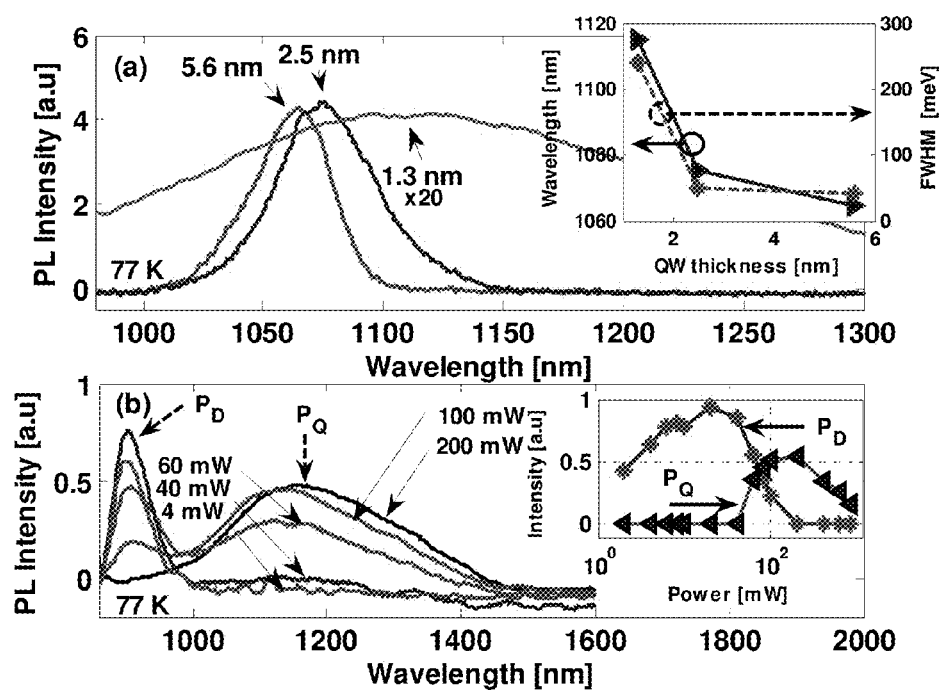

PL measurements at 77 K of this structure, shown in FIG. 9a, showed a single PL line occurring at approximately 1216 nm. A clear, intense blue shift due to nitrogen localization levels is observed as a function of the laser excitation power, as well as a low defect concentration confirmed by the negligible short wavelength peak ($P_D$ in FIG. 7). The PL spectrum at 300 K is shown in FIG. 7B. The peak intensity was only about four times lower than the peak intensity at 77 K, indicating the very high optical quality of the grown QW. Further increase of the DMHy flow rate during the second "high" step of the growth increased the average N content to 2.3% and improved the SIMS uniformity, indicating higher incorporation of N during growth, but it resulted in multiple PL peaks, reflecting a lower crystal quality.

The present example demonstrated that the deposition technique of the present embodiments allows controllable concentration of nitrogen in the GaInAsN/GaAs structures. The concentration was higher at the first grown interface and decreased to lower values along the growth direction. The present inventors found that these findings can be interpreted in terms of the surface kinetics, strain gradient enhanced diffusion, and N desorption. This discovery was used for tailoring a double DMHy flow process for the growth of high quality, low defect, N-cluster-free GaInAsN quantum wells.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A light detection system, comprising a light absorbing layer made of a semiconductor having majority carriers and minority carriers, and being incorporated with bandgap modifying atoms at a concentration selected so as to allow generation of photocurrent indicative of absorption of photons at any wavelength at least in the range of from about 3 μm to about 5 μm.

2. The system of claim 1, wherein said bandgap modifying atoms comprise nitrogen atoms.

3. The system of claim 1, wherein said bandgap modifying atoms comprise bismuth atoms.

4. The system of claim 1, wherein said semiconductor is an n-type semiconductor so that said majority carriers are electrons and said minority carriers are holes.

5. The system of claim 1, wherein said light absorbing layer comprises a III-V semiconductor.

6. The system of claim 5, wherein said light absorbing layer comprises InAsN.

7. The system of claim 5, wherein said light absorbing layer comprises InAsSbN.

8. The system of claim 1, further comprising a barrier layer, adjacent to said light absorbing layer and having a semiconductor configured for providing a barrier to said majority carriers.

9. The system of claim 8, wherein said barrier layer comprises a III-V semiconductor.

10. The system of claim 8, further comprising a contact layer made of an n-doped semiconductor and being adjacent to said barrier layer at an opposite side to said light absorbing layer.

11. The system of claim 10, wherein said contact layer comprises a III-V semiconductor.

12. The system of claim 10, wherein said contact layer comprises InAs.

13. The system of claim 8, further comprising a contact layer made of a p-doped semiconductor and being adjacent to said barrier layer.

14. The system of claim 1, being configured to operate in a background limited condition for a background temperature of 300 K, while a temperature of said light absorbing layer is at least 150K.

15. The system of claim 1, wherein said concentration of said bandgap modifying atoms is at least 0.1%.

16. A light detection system, comprising a light absorbing layer made of a semiconductor having majority carriers and minority carriers, and being incorporated with bandgap modifying atoms selected from the group consisting of nitrogen and bismuth at a concentration of at least 0.1%.

17. A method of detecting light, comprising causing a light to interact with a light detection system having a light absorbing layer made of a semiconductor having majority carriers and minority carriers, and being incorporated with bandgap modifying atoms selected from the group consisting of nitrogen and bismuth at a concentration of at least 0.1%.

18. The method of claim 17, further comprising maintaining a temperature of said light absorbing layer at a temperature of at least 150K while operating said light detection system at background temperature of 300 K.

19. A method of fabricating a light detection system, comprising:
growing on a substrate a light absorbing layer made of a semiconductor having majority carriers and minority carriers and being incorporated with bandgap modifying atoms at a concentration selected so as to allow generation of photocurrent indicative of absorption of photons at any wavelength within a predetermined range.

20. The method of claim 19, wherein said bandgap modifying atoms comprise nitrogen atoms.

21. The method of claim 19, wherein said bandgap modifying atoms comprise bismuth atoms.

22. The method of claim 19, wherein said semiconductor is an n-type semiconductor so that said majority carriers are electrons and said minority carriers are holes.

23. The method of claim 19, wherein said light absorbing layer comprises a III-V semiconductor.

24. The method of claim 19, further comprising growing on said light absorbing layer a barrier layer having a semiconductor configured for providing a barrier to said majority carriers.

25. The method of claim 24, wherein said barrier layer comprises comprises a III-V semiconductor.

26. The method of claim 24, further comprising growing on said barrier layer a contact layer made of an n-doped semiconductor.

27. The method of claim 26, wherein said contact layer comprises a III-V semiconductor.

28. The method of claim 24, further comprising growing on said barrier layer a contact layer made of a p-doped semiconductor and being adjacent to said barrier layer at an opposite side to said light absorbing layer.

29. The method of claim 19, wherein said growing said light absorbing layer is effected by MOCVD.

30. The method of claim 19, wherein said growing said light absorbing layer is effected by a process selected from the group consisting of Molecular Beam Epitaxy (MBE) and metal organic MBE.

* * * * *